United States Patent

Brady et al.

[11] Patent Number: 5,299,090
[45] Date of Patent: Mar. 29, 1994

[54] PIN-FIN HEAT SINK

[75] Inventors: Kevin J. Brady, Millington; Charles Cohn, Wayne, both of N.J.

[73] Assignee: AT&T Bell Laboratories, Murray Hill, N.J.

[21] Appl. No.: 85,232

[22] Filed: Jun. 29, 1993

[51] Int. Cl.[5] .............................................. H05K 7/20
[52] U.S. Cl. ..................................... 361/703; 29/412; 29/890.054; 174/16.3; 165/80.3; 165/185; 257/722
[58] Field of Search ...................... 165/80.3, 80.4, 185; 174/16.3; 257/707, 712, 713, 722; 361/383, 384, 386–389; 29/890.035, 890.054, 412

[56] References Cited

U.S. PATENT DOCUMENTS

| 3,706,127 | 12/1972 | Oktay et al. | 361/383 |
|---|---|---|---|
| 4,479,140 | 10/1984 | Horvath | 357/81 |
| 4,508,163 | 4/1985 | McCarthy | 165/80 |
| 4,712,159 | 12/1987 | Clemens | 361/386 |
| 4,849,856 | 7/1989 | Funari et al. | 361/386 |
| 5,049,981 | 9/1991 | Dahringer | 357/81 |
| 5,057,903 | 10/1991 | Olla | 357/72 |
| 5,057,908 | 10/1991 | Weber | 357/81 |
| 5,057,909 | 10/1991 | Mok et al. | 357/81 |
| 5,107,330 | 4/1992 | Dahringer | 357/81 |

FOREIGN PATENT DOCUMENTS 1163126  6/1985  U.S.S.R. ................... 165/185

OTHER PUBLICATIONS

Buller et al., "Dendritic Heat Sink", IBM Technical Disclosure Bulletin, vol. 23, No. 11, Apr. 1981, p. 4853.

Primary Examiner—Gregory D. Thompson
Attorney, Agent, or Firm—Oleg E. Alber

[57] ABSTRACT

A housed integrated circuit unit package is provided with a heat sink for removal and dissipation of heat from electronic circuits housed in packages. The heat sink, mounted on an outer surface of the package, includes a plurality of pins secured at one end with a retainer and flared out at the other end into a starburst or bouquet configuration, the pins being in the form of rods selected from solid cylinders and tubes. The bottom of the retainer-bound end is coated with a securing substance, such as solder or a heat-conducting adhesive, which is planarized to facilitate positioning of the heat sink on the package. The heat sink is secured to the package by means of solder or a heat-conducting adhesive. The heat sink is produced by securing a plurality of elongated rods by retainers placed at intervals corresponding to a height of the heat sink, cutting off said rods adjacent to one side of the retainer, and flaring the rods at the other free end of the cut-off rods into a starburst-like configuration. The retained ends of the rods are dipped into a solder or heat-conducting adhesive and planarized to provide a planar surface for mounting the heat sink on the surface of the package.

7 Claims, 3 Drawing Sheets

JUNCTION TO AMBIENT AIR RESISTANCE $\theta_{ja}(°C/W)$

COOLING AIR FLOW RATE (ft/min)

PIN-FIN HEAT SINK

FIELD OF THE INVENTION

This invention concerns a heat sink for removal and dissipation of heat from electronic circuits, such as housed in packages.

BACKGROUND OF THE INVENTION

Integrated circuit units, such as integrated circuit chips (ICs) and hybrid integrated circuit (HIC) modules, are conventionally housed in suitable plastic or ceramic packages to protect them mechanically, electrically and chemically. However, such packages are not always capable of efficiently dissipating the heat generated by the circuits. In order to overcome this problem, a given package is provided with a heat sink that is attached to its outer surface. Typically a heat sink utilizes an array of elongated fins arranged on a common platform. The heat sink is often used in conjunction with a cooling fluid, such as air, circulating through the spaces between the fins for conducting the heat away from the circuit. One example of a prior art pin-fin heat sink, 61, mounted on a pin grid array package, 62, is shown in FIG. 6. In FIG. 7 is shown another version of a prior art channeled-fin heat sink, 71, mounted on quad flatpack package 72. A drawback of the prior art heat sink is its relative high cost. A pin-fin heat sink is made by a costly process of machining out of a block of metal a plurality of square pin fins. Furthermore, a channeled fin heat sink is highly dependent on the direction of the cooling fluid flow. The fluid flowing through the channels between the fins of the channeled-fin heat sink removes heat much more efficiently than the fluid flowing transverse to the heat sink.

SUMMARY OF THE INVENTION

This invention embodies a heat sink for removal and dissipation of heat from electronic circuits housed in IC packages. The heat sink, mounted on an outer surface of the package, includes a plurality of pins secured at one end with a retainer and flared out at the other end into a starburst or bouquet configuration. The bottom of the retainer-bound end is coated with a securing substance, such as solder or a heat-conducting adhesive, which is planarized to facilitate positioning of the heat sink on the package. The heat sink is secured to the package by means of solder or a heat-conducting adhesive. The heat sink is produced by securing a plurality of elongated rods by retainers placed along the rods at intervals corresponding to a height of the heat sink, cutting off said rods adjacent to one side of the retainer to form pins of the heat sink, and flaring the rods at the other free end of the cut-off rods into a starburst-like configuration. The retained ends of the rods are dipped into a solder or heat-conducting adhesive and planarized to provide a planar surface for mounting the heat sink on the surface of the package.

DETAILED DESCRIPTION

Figure 1:
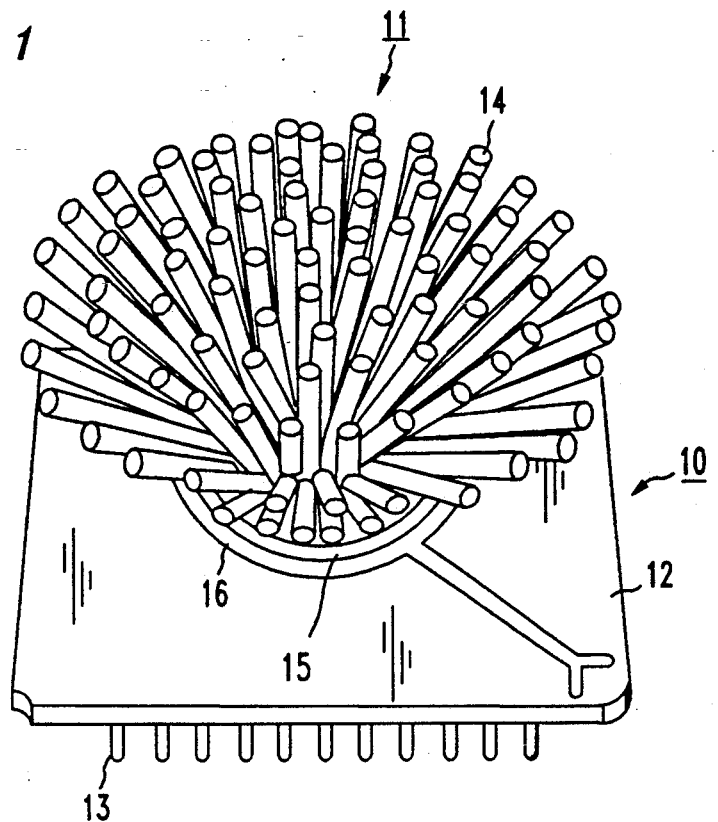
FIG. 1 is a schematic representation of an IC package with a pin-fin heat sink embodying the invention.

Shown in FIG. 1 is a schematic representation of a typical integrated circuit (IC) package 10, with a heat-sink, 11. The IC package includes an integrated circuit unit (not shown) and a plurality of electrical conductors, 13. The IC unit may be a chip or a module with at least one chip and other elements and conductors of a hybrid integrated circuit. The housing encloses and protects the IC unit, while allowing electrical connections to be made to the circuit with conductors 13. In the exemplary embodiment shown in FIG. 1 the electrical conductors are pins of a pin grid array. Alternatively, the conductors could be leads of a lead frame. The heat sink is secured to the IC package by means of solder or an adhesive. The latter comprises an adhesive, such as an epoxy, in which are dispersed particles of heat conductive material, such as copper, aluminum, silver, etc.

Heat sink 11 includes a plurality of pins, 14, in the form of solid rods or tubes of highly thermally conductive material. The pins are secured in a retainer, such as a ring, 15, while the upper part of the pins is flared out into a star-burst or bouquet shape. The size of the ring and the number of pins are selected such that the pins fit into the ring in a tightly fitting manner and to fit the size of the device. The pins are additionally secured in the ring by means of a solder or an adhesive. The lower surface of the heat sink presents a planar surface which is even with the lower rim of the ring to facilitate positioning the heat sink on and attaching it to IC package 10. Depending on the construction of the device, the heat sink may be secured on the insulating material 12 of the housing or on a heat-spreader plate, such as plate 16, by means of solder or an adhesive. The flared configuration of the pins permits the use of the heat sink with cooling fluid systems without regard for the direction of the flow of the cooling fluid. Furthermore, the heat sink is relatively easy to produce.

Figure 2:
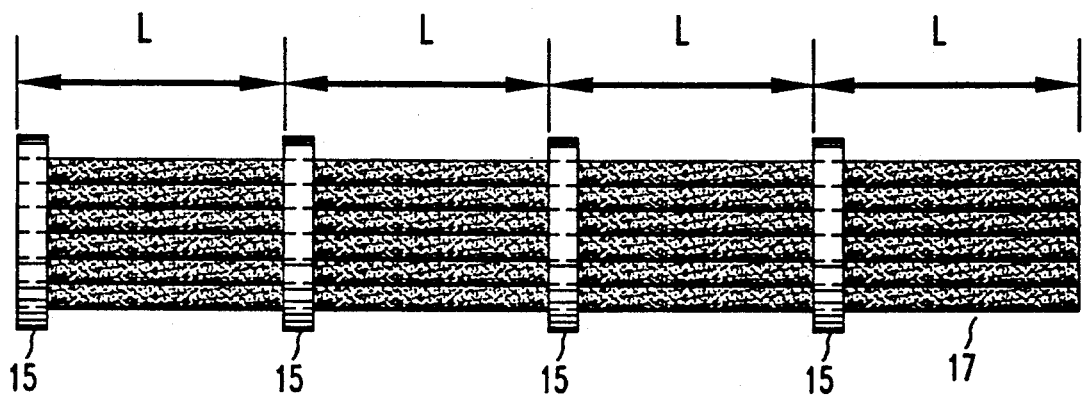
FIG. 2 is a schematic representation of an assembly of rods and retainer rings in the process of fabricating the pin-fin heat sink.
Figure 3:
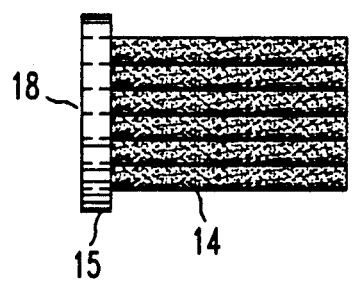
FIG. 3 is a schematic representation of a bundle of pins and a retaining ring, separated from the assembly of FIG. 2.

The heat sink is produced by bunching together a selected number of elongated metal rods, 17, and fastening the rods by means of retainers, such as metal rings 15, positioned along the rods at spaced intervals, L (FIG. 2). The rods may be solid or hollow (tubular) and are of a highly thermally conductive material, such as copper, copper alloys, and aluminum. Rings 15 are spaced at intervals (L) corresponding to a desired length of the pins in the heat sink such that when the rods are cut off and flared out at the free end, it will result in the required thermal characteristics and overall volume. A bundle of rods 17 is cut into sections of a preselected length at one side of each ring resulting in a preform shown in FIG. 3 as including pins 14 and rings 15. The size of the ring is selected to tightly embrace each bundle of rods. Instead of a solid ring, the rods may be bound by means of a tape or wire, securing the rods into a tight bundle at the bound end. The rods at the ring side of each bundle are further secured by dipping the cut off end 18 into a molten solder or into a liquid adhesive provided with a filler of heat conducting particles. The surface of the dipped end, after cooling, is ground or machined flat, if needed, to ensure planar fit of the bottom of the heat sink to the IC package.

Figure 4:
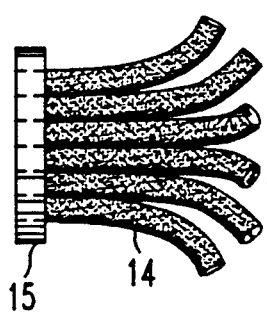
FIG. 4 is a schematic representation of the heat sink formed by flaring the pins into a star-burst or bouquet shape.

The rods are flared or fanned outwardly resulting in a star-burst or bouquet form at the free end of the bundle (FIG. 4). To protect the metal of the heat sink from corrosion, the heat sink, with the exception of the bottom of the heat sink, is painted with a thin layer of black paint. The painting also enhances the aesthetic nature of the heat sink, as compared to a possible blotched appearance of oxidized metal of the heat sink.

Figure 5:
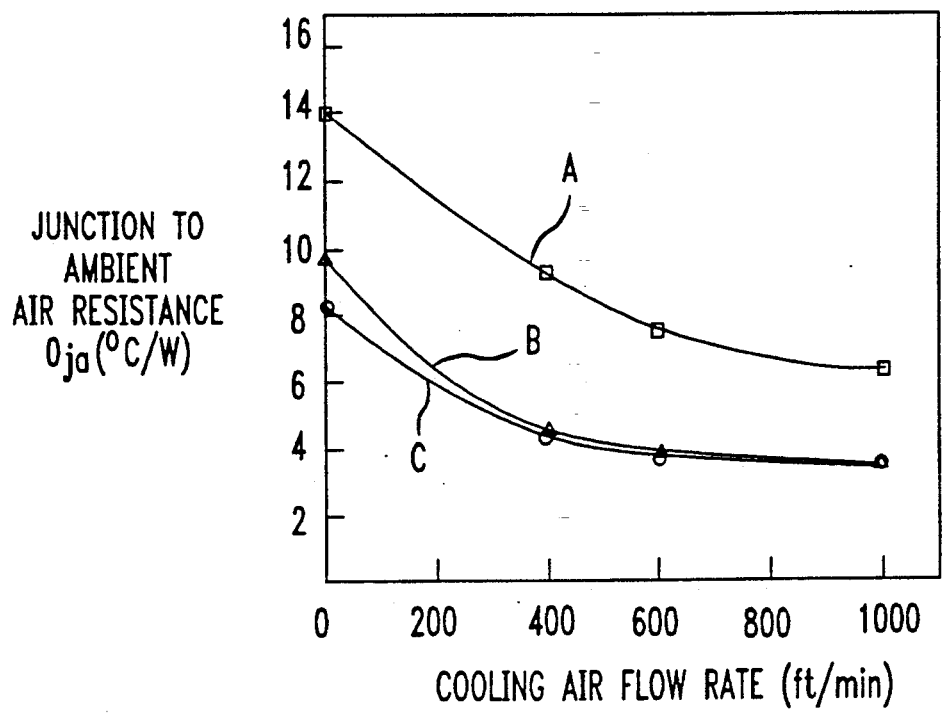
FIG. 5 is a plot comparing thermal characteristics of a device without the heat sink (curve A), with a conventional pin-fin heat sink (curve B), and with a heat sink embodying this invention (curve C)
Figure 6:
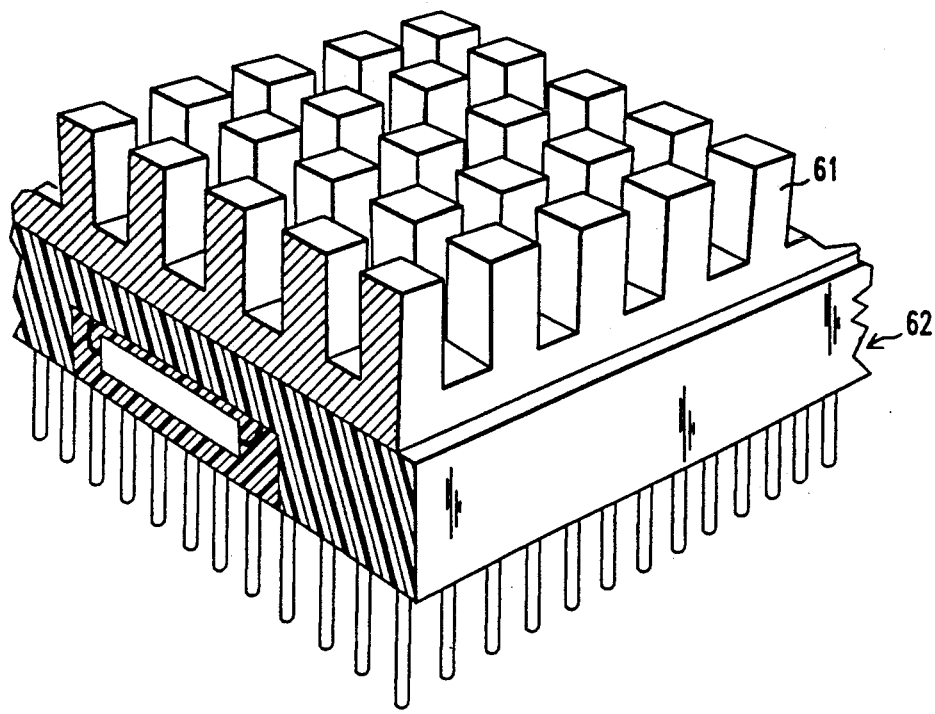
FIG. 6 is a schematic representation of a device with a prior art conventional pin-fin heat sink.
Figure 7:
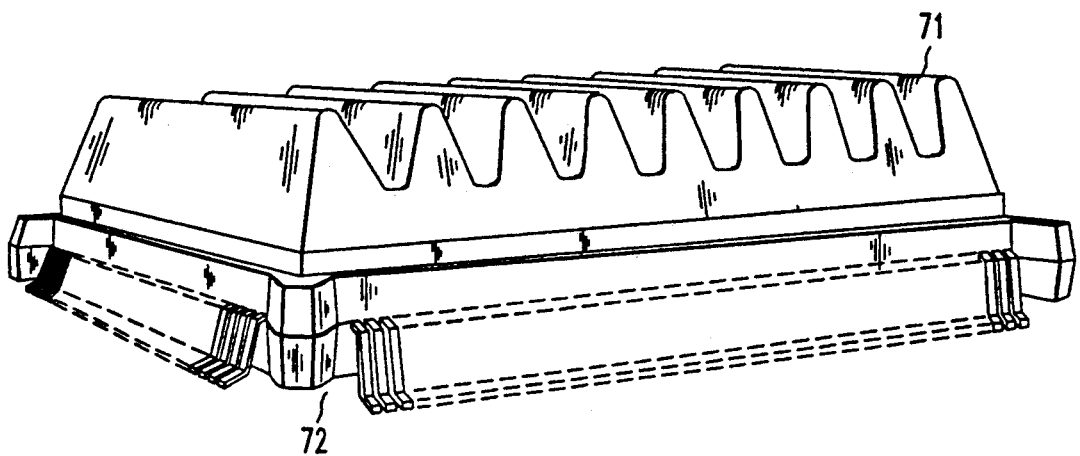
FIG. 7 is a schematic representation of a device with a prior art channeled-fin heat sink.

In FIG. 5 is shown a comparison of thermal characteristics of encapsulated devices with an exemplary bouquet-style heat sink, without a heat sink and with a conventional pin-fin heat sink of the type shown in FIG. 6. The thermal characteristics were tested on a 159 I/O CPGA (ceramic pin grid array) package 16×16 pin grid array at sea level and room ambient temperature, with a 0.269 inch square power chip and a Cu-W heat spreader. A comparison of the thermal characteristics of the device tested without heat sink (plot A), with a finned heat sink (plot B) and with a bouquet heat sink (plot C), shows that the bouquet heat sink has excellent heat removing characteristics, especially at lower cooling air flow rates. The plots show that the performance of the device with an exemplary heat sink is superior to devices without any heat sink and is favorably comparable to devices with the commercially available pin-fin heat sink.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. An encapsulated device with a heat sink, which comprises;
    a housing enclosing an integrated circuit unit, and
    said heat sink secured on an outside planar surface of the housing, in which
    said heat sink comprises a plurality of elongated pins held at one end within a retainer and having a flared-out star-burst configuration at the opposite end, said pins being of a material having high thermal conductive characteristics, said pins at said one end having a surface planarized by a means of a substance selected from solder or plastic adhesives for mounting said heat sink on said planar surface of the housing.

2. The device of claim 1 in which said pins are in the form of rods selected from solid cylinders and tubes.

3. The device of claim 1 in which said retainer is a ring.

4. The device of claim 1 in which the pins at said one end are further secured within the retainer by securing means selected from solder or plastic adhesive.

5. A method of producing a heat sink comprising a plurality of elongated cylinders held at one end by a retainer and having a flared-out star-burst configuration at the opposite end, which comprises:
    placing retainers along a length of a plurality of elongated cylinders, said retainers keeping the cylinders bunched at intervals of predetermined length and said rods being of a material having high thermal characteristics.
    cutting the rods into sections, each section including rods of said predetermined length and a retainer,
    coating an end surface of each cylinder and an end surface of the retainer with a substance selected from solder or thermally conductive adhesive, and planarizing coated end surfaces, if needed.

6. The method of claim 5 in which said cylinders are selected from solid rods, pins or tubes.

7. The method of claim 5 in which said retainer is a ring.

* * * * *